(12) United States Patent
Miglio

(10) Patent No.: US 10,734,226 B2
(45) Date of Patent: Aug. 4, 2020

(54) METHOD FOR INDUSTRIAL MANUFACTURING OF A SEMICONDUCTOR STRUCTURE WITH REDUCED BOWING

(71) Applicant: PILEGROWTH TECH S.R.L., Como (IT)

(72) Inventor: Leonida Miglio, Domaso (IT)

(73) Assignee: PILEGROWTH TECH S.R.L., Como (IT)

( * ) Notice: Subject to any disclaimer, the term of this patent is extended or adjusted under 35 U.S.C. 154(b) by 0 days.

(21) Appl. No.: 16/096,810

(22) PCT Filed: Apr. 26, 2017

(86) PCT No.: PCT/EP2017/059970
§ 371 (c)(1),
(2) Date: Oct. 26, 2018

(87) PCT Pub. No.: WO2017/186810
PCT Pub. Date: Nov. 2, 2017

(65) Prior Publication Data
US 2019/0131127 A1    May 2, 2019

(30) Foreign Application Priority Data

Apr. 27, 2016   (IT) .......................... 102016000043061

(51) Int. Cl.
*H01L 21/02* (2006.01)
*A47J 31/36* (2006.01)

(52) U.S. Cl.
CPC ........ *H01L 21/02639* (2013.01); *A47J 31/36* (2013.01); *H01L 21/0243* (2013.01);
(Continued)

(58) Field of Classification Search
CPC ........... H01L 21/0254; H01L 21/02639; H01L 21/02381; H01L 21/02532
See application file for complete search history.

(56) References Cited

U.S. PATENT DOCUMENTS

2006/0216849 A1   9/2006 Letertre
2013/0037857 A1   2/2013 Von Kanel et al.
(Continued)

FOREIGN PATENT DOCUMENTS

WO   WO 2014/140082 A1   9/2014

OTHER PUBLICATIONS

Falub et al., "Scaling Hetero-Epitaxy from Layers to Three-Dimensional Crystals", Science, vol. 335, No. 6074, Mar. 16, 2012, pp. 1330-1334.

*Primary Examiner* — Caridad Everhart
(74) *Attorney, Agent, or Firm* — Polsinelli PC

(57) ABSTRACT

A method for manufacturing a semiconductor structure with reduced bowing for applications in the field of power electronics, photonics, optoelectronics, solar energy conversion and the like, which comprises: a step of providing at least a first layer of a first semiconductor material, said first layer comprising a substrate of said first semiconductor material, which extends along a first reference plane, and a plurality of first portions of said first semiconductor material, which are mutually spaced and extend in elevation from said substrate along axes perpendicular to said first reference plane, said first portions having ends in distal position with respect to said substrate; a step of providing at least a second layer of a second semiconductor material, said second layer comprising second portions of said second semiconductor material, each of which is joined to the ends of a plurality of said first portions, said second portions being mutually spaced and extending along a second reference plane parallel to said first reference plane; The first portions of the first layer are produced with an aspect ratio that depends on a dimension of said second portions, measured along said second reference plane. In a further aspect thereof, the invention relates to a semiconductor structure for applica- (Continued)

tions in the field of power electronics, photonics, optoelectronics, solar energy conversion and the like.

20 Claims, 10 Drawing Sheets

(52) U.S. Cl.
CPC .... *H01L 21/0254* (2013.01); *H01L 21/02381* (2013.01); *H01L 21/02433* (2013.01); *H01L 21/02529* (2013.01); *H01L 21/02532* (2013.01); *A47J 2201/00* (2013.01)

(56) References Cited

U.S. PATENT DOCUMENTS

| | | | |
|---|---|---|---|
| 2015/0004366 A1* | 1/2015 | Yeh | B82Y 40/00 428/141 |
| 2015/0255404 A1* | 9/2015 | Adkisson | H01L 23/53223 257/774 |
| 2016/0307800 A1* | 10/2016 | Frisina | C30B 33/00 |

\* cited by examiner

1

METHOD FOR INDUSTRIAL MANUFACTURING OF A SEMICONDUCTOR STRUCTURE WITH REDUCED BOWING

CROSS REFERENCE TO RELATED APPLICATIONS

This application is a National Phase filing under 35 U.S.C. § 371 of PCT/EP2017/059970 filed on Apr. 26, 2017; and this application claims priority to Application No. 102016000043061 filed in Italy on Apr. 27, 2016. The entire contents of each application are hereby incorporated by reference.

DESCRIPTION

The present invention relates to a method for industrial manufacturing of a semiconductor structure for applications in the field of power electronics, photonics, optoelectronics, solar energy conversion and the like, in particular for manufacturing power electronic devices (for example transistors, diodes, thyristors, etc.), photonic devices (for example lasers, light amplifiers, etc.), optoelectronic devices (for example phototransistors, photodiodes, photoresistors, photothyristors, etc.), photovoltaic cells and the like.

As is known, industrial manufacturing of electronic devices for applications in the field of power electronics, photonics, optoelectronics, solar energy conversion and the like, provides for the use of semiconductor structures destined to be appropriately processed to manufacture the aforesaid electronic devices.

These semiconductor structures are in turn manufactured from wafers of semiconductor material by means of semiconductor material processing techniques, such as Physical Vapor Deposition (PVD), Chemical Vapor Deposition (CVD), Molecular Beam Epitaxy (MBE), wafer bonding, selective etching, lithography and the like.

In general, the aforesaid semiconductor structures comprise a bulk layer of a given semiconductor material, for example silicon (Si), coated with a thick film of another semiconductor material, for example silicon carbide (SiC), with a thickness in the order of tens or hundreds of μm, and destined to be further processed to manufacture the desired electronic devices.

A typical problem of these semiconductor structures consists in the occurrence of residual thermal stresses that originate in the interface regions between the various superimposed layers, when the aforesaid structures are returned to room temperature after manufacturing (which can take place at very high temperatures, for example from 400-1000° C.).

These residual thermal stresses, resulting from the different coefficients of thermal expansion of the semiconductor materials that form the superimposed layers, can easily cause bowing of the structures, which prevent further processing of the thick film or lead to the nucleation of extensive microcracks in the layers, in particular in the thick film.

The state of the art, for example the patent application US2006/0202209A1, proposes semiconductor structures of "sandwich" type, in which a bulk layer of a given semiconductor material (for example Si) is coated on opposite sides with thick films of another semiconductor material (for example SiC) so as to obtain a compensation for residual thermal stresses occurring at opposite interface regions.

Although semiconductor structures of this type have the advantage of limited bowing caused by residual thermal stresses, they are characterised by being very fragile, which makes them very difficult to handle and to implement further treatments on.

The patent application WO2013/061047A2 describes a semiconductor structure in which a bulk layer in Si is partially coated by a silicon oxide ($SiO_2$) or silicon nitride (SiN) masking layer that defines appropriate windows for deposition of the thick film.

It has been seen how these structures are subject to excessive bowing caused by residual thermal stresses when the aforesaid windows are relatively large (for example a few $mm^2$) and the thicknesses of the material deposited exceeds a few micrometers, as is instead required in numerous industrial applications, for example for manufacturing electronic power devices. Semiconductor structures are known in which the bulk layer is processed, by means of optical lithography and selective etching techniques, in order to obtain a substrate extending perpendicularly from which are ridges or pillars, having free ends on which a thick film is provided by means of suitable epitaxial deposition or wafer bonding techniques.

Examples of these semiconductor structures are described, for example, in the following documents:
patent application US2006/0216849A1;
patent application WO2011/135432A1;
"Scaling Hetero-Epitaxy from Layers to Three-Dimensional Crystals" by Falub, C. V.; von Kaenel, H.; Isa, F.; et al.—SCIENCE, Volume: 335, Issue: 6074, Pages: 1330-1334, Published: Mar. 16, 2012;
"Engineered Coalescence by Annealing 3D Ge Microstructures into High-Quality Suspended Layers on Si" by Salvalaglio, M.; Bergamaschini, R.; Isa, F.; et al.—ACS APPLIED MATERIALS & INTERFACES, Volume: 7, Issue: 34, Pages: 19219-19225, Published: Sep. 2, 2015;
"Defect reduction in epitaxial 3C—SiC on Si(001) and Si(111) by deep substrate patterning (CONFERENCE PAPER)" by von Kanel, H., Miglio, L., Crippa, D., Kreiliger, T., Mauceri, M., Puglisi M., Mancarella, F., Anzalone, R., Piluso, N., La Via, F.—Materials Science Forum, Volume 821-823, 2015, Pages 193-196, European Conference on Silicon Carbide and Related Materials, ECSCRM 2014; Grenoble; France; Sep. 21, 2014 through Sep. 25, 2014.

It has been amply seen how semiconductor structures of this type are characterised, in principle, by reduced bowing caused by residual thermal stresses and by a reduced probability of the occurrence of microcracks in the thick film, in particular in the case in which the aspect ratio (dimension of height over base dimension of the section) of the aforesaid ridges or pillars is relatively high, for example greater than 2.

In this regard, a publication by Z. Chen, H. Yan, Z. Gan, S. Liu,—Proc. of the $59^{th}$ IEEE Electronic Components and Technology Conference 2009, 1-4, page 1824, points out how, in semiconductor structures of this type, there is a significant further decrease in residual thermal stresses if the aspect ratio of the aforesaid ridges or pillars has even higher values, for example in the range from 5-10.

Unfortunately, semiconductor structures of this type without prescriptions for the lateral size of the film do not yet provide practically satisfactory results with regard to controlled reduction of bowing and are difficult to apply on an industrial scale.

Therefore, there is still a great need for semiconductor structures that provide high performances in terms of reduction of residual thermal stresses (hence with a high aspect ratio for the ridges or pillars extending from the substrate), that can be easily reproduced on an industrial scale and that facilitate industrial manufacturing of the desired electronic devices. The present invention intends to answer this need by providing a method for manufacturing a semiconductor structure for applications in the field of power electronics, photonics, optoelectronics, solar energy conversion and the like, according to claim 1 and the related dependent claims, set forth below.

In a general definition thereof, the method according to the invention comprises:

a step of providing at least a first layer of a first semiconductor material, said first layer comprising a substrate of said first semiconductor material, which extends along a first reference plane, and a plurality of first portions of said first semiconductor material, which are mutually spaced and extend in elevation from said substrate along axes perpendicular to said first reference plane, said first portions each having an end in distal position with respect to said substrate;

a step of providing at least a second layer of a second semiconductor material, said second layer comprising second portions of said second semiconductor material, each of which is joined to the ends of a plurality of said first portions, said second portions being mutually spaced and extending along a second reference plane parallel to said first reference plane;

According to the invention, said first portions are produced with an aspect ratio that depends on a dimension of said second portions, measured along said second reference plane.

In a further aspect thereof, the present invention relates to a semiconductor structure for applications in the field of power electronics, photonics, optoelectronics, solar energy conversion and the like, according to claim 8 and the related depended claims, set forth below.

In a general definition thereof, the semiconductor structure, according to the invention, comprises:

at least a first layer of a first semiconductor material, said first layer comprising a substrate of said first semiconductor material that extends along a first reference plane, and a plurality of first portions of said first semiconductor material, which are mutually spaced and extend in elevation from said substrate along axes perpendicular to a first reference plane, said first portions having ends in distal position with respect to said substrate;

at least a second layer of a second semiconductor material, said second layer comprising second portions of said second semiconductor material, each of which is joined to the ends of a plurality of said first portions, said second portions being mutually spaced and extending along a second reference plane parallel to said first reference plane; p According to the invention, said first portions are produced with an aspect ratio that depends on a dimension of said second portions, measured along said second reference plane or a plane parallel thereto.

Preferably, said first portions have an aspect ratio ($R_A$) that depends on a dimension (w) of said second portions, measured along said second reference plane or a plane parallel thereto, according to a function of non-linear type, in particular of sub-linear type.

Preferably, said first portions have an aspect ratio ($R_A$) that depends on a dimension (w) of said second portions, measured along said second reference plane or a plane parallel thereto, according to a function of the type:

$$R_A = C(w/W_R)^{k1}$$

wherein:

$W_R$ is a reference value for the dimension of said second portions, with $W_R=1000$ µm; k1 is a coefficient lower than 1, with $0.5 \le k1 \le 0.8$;

C is a coefficient that depends on the characteristics of said first and second layers, with $10 \le C \le 50$, more preferably with $20 \le C \le 40$.

Preferably, said first portions have an aspect ratio ($R_A$) that depends on a dimension (w) of said second portions, measured along said second reference plane or a plane parallel thereto, according to a function of the type:

$$R_A = -A + B(w/W_R)^{k2}$$

wherein:

$W_R$ is a reference value for the dimension of said second portions, with $W_R=1000$ µm;

k2 is a coefficient lower than 1, with $0.5 \le k2 \le 0.8$;

A is a coefficient that depends on the characteristics of said first and second layers, with $1 \le A \le 15$;

B is a coefficient that depends on the characteristics of said first and second layers, with $10 \le B \le 50$.

Preferably, said substrate comprises a plurality of boundary areas, in each of which a corresponding group of said first portions is arranged, said second portions being arranged at said boundary areas.

Preferably, said first semiconductor material is Si.

Preferably, said second semiconductor material is a semiconductor material selected among: SiC, GaN, Ge, GaAs or another semiconductor material of the III-V groups.

Preferably, said first semiconductor material is Si and said second semiconductor material is SiC in the 3C—SiC crystalline phase.

BRIEF DESCRIPTION OF THE DRAWINGS

Further characteristics and advantages of the present invention will become more apparent with reference to the description given below and to the accompanying figures, provided purely for explanatory and non-limiting purposes, wherein.

DETAILED DESCRIPTION

Figure 1:
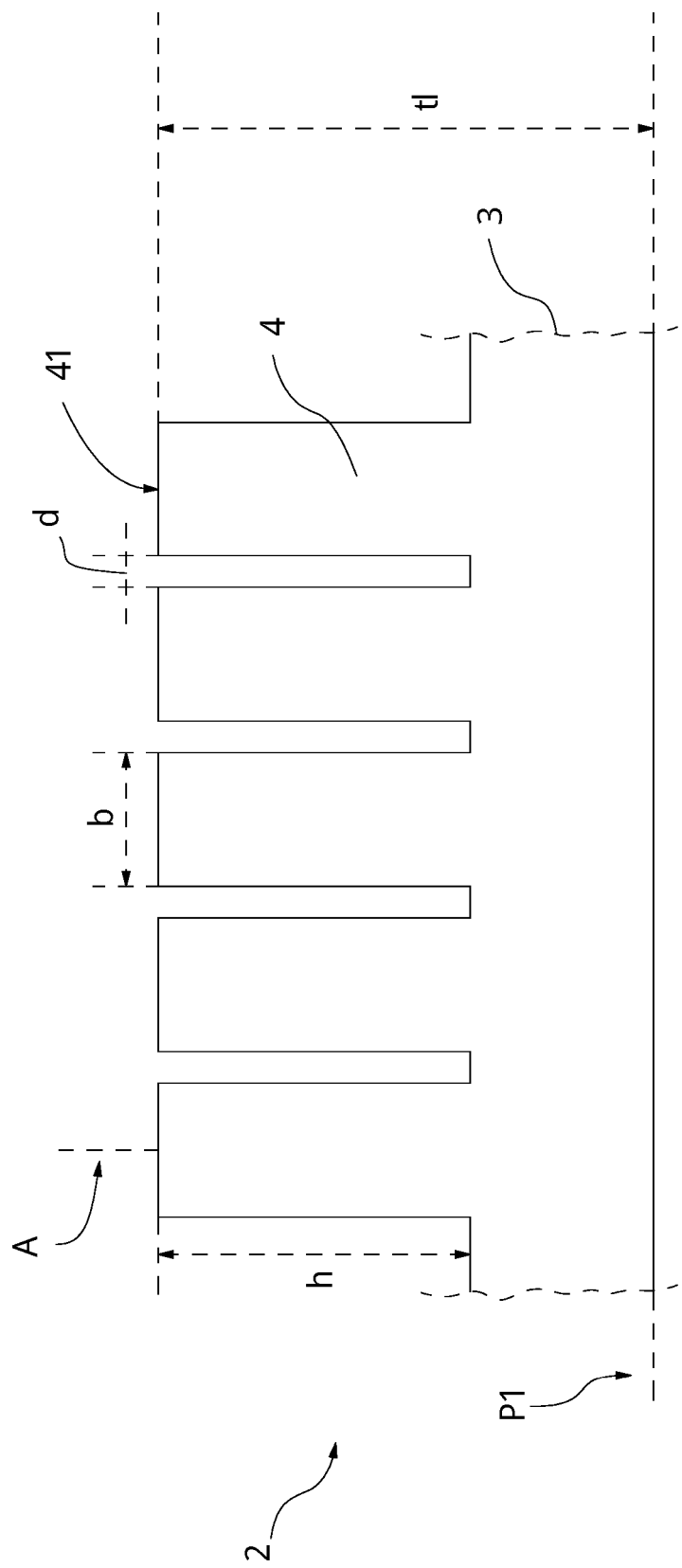
FIGS. 1-4 illustrate, by way of example, an embodiment of the method, according to the present invention, and the semiconductor structure manufactured with this method.

With reference to the aforesaid figures, in one aspect thereof, the present invention relates to a method for manufacturing, on an industrial scale, a semiconductor structure 1 for applications in the field of power electronics, photonics, optoelectronics, solar energy conversion and the like.

The method, according to the invention, comprises a first step of providing a first layer 2 of a first semiconductor material.

Preferably, said first semiconductor material is silicon (Si), for example Si with orientation of the lattice of (111) or (100) type.

Preferably, the layer 2 has a monolithic structure.

According to some embodiments of the invention, however, the layer 2 could consist of several superimposed sub-layers, according to a structure of multi-layer type.

The layer 2 has a thickness t1, measured along a plane perpendicular to the reference plane P1.

Preferably, the thickness t1 of the layer 6 is between 100 μm and 1000 μm.

In the semiconductor structure 1, the first layer 2 is adapted to form a bulk layer to support a thick film of another semiconductor material intended to be further processed to manufacture the desired electronic devices.

The first layer 2 comprises a substrate 3 of said first semiconductor material that extends along a first reference plane P1.

The first layer 2 also comprises a plurality of first portions 4 of said first semiconductor material.

The first portions 4 of the first layer 2 extend in elevation from the substrate 3 along axes A substantially perpendicular with respect to the reference plane P1, along which the substrate 3 extends.

The first portions 4 of the layer 2 are provided with a free end 41 in distal position with respect to the substrate 3.

In practice, the first portions 4 of the layer 2 preferably consist of shaped pillars extending perpendicularly from the substrate 3 forming a single body therewith.

The first portions 4 of the layer 2 have a height h, defined herein, in general, as the measurement of the distance that separates the free end 41 of the portions 4 from the substrate 3, along the axes of extension A of the aforesaid portions (or axes parallel thereto).

Preferably, all the first portions 4 of the layer 2 have the same height h.

Preferably, the height h of the first portions 4 of the layer 2 is between 3 μm and 50 μm.

Preferably, the height h of the first portions 4 of the layer 2 is between 8 μm and 40 μm.

The cross section of the first portions 4 of the layer 2, along the reference plane P1 (or a plane parallel thereto) and perpendicular to the axes of extension A of the aforesaid first portions, can have any geometric shape, for example a polygonal (triangular, rectangular, square, hexagonal, etc.), circular or ellipsoidal geometric shape.

The first portions 4 of the layer 2 can all have cross sections with the same geometric shape or can have cross sections with different geometric shapes.

The first portions 4 of the layer 2 have a width b, defined herein, in general, as the measurement of the largest dimension of the cross section of the aforesaid portions, as defined above.

For example, in the case in which the cross section of the first portions 4 has the geometric shape of a triangle, square or rectangle, the width b is the measurement of the longer side of the aforesaid cross section.

In the case in which the cross section of the first portions 4 has the geometric shape of any regular polygon with more than four sides, the largest dimension b is the measurement of the longer diagonal of the aforesaid cross section.

In the case in which the cross section of the first portions 4 has a circular shape, the largest dimension b is the measurement of the diameter of the aforesaid cross section.

In the case in which the cross section of the first portions 4 has an ellipsoidal shape, the largest dimension b is the measurement of the larger diameter of the aforesaid cross section. Further examples are possible in view of the shape of the cross section of the first portions 4 of the layer 2.

Preferably, the width b of the first portions 4 of the layer 2 is between 1 μm and 4 μm.

Preferably, the width b of the first portions 4 of the layer 2 is 2 μm.

Figure 2:
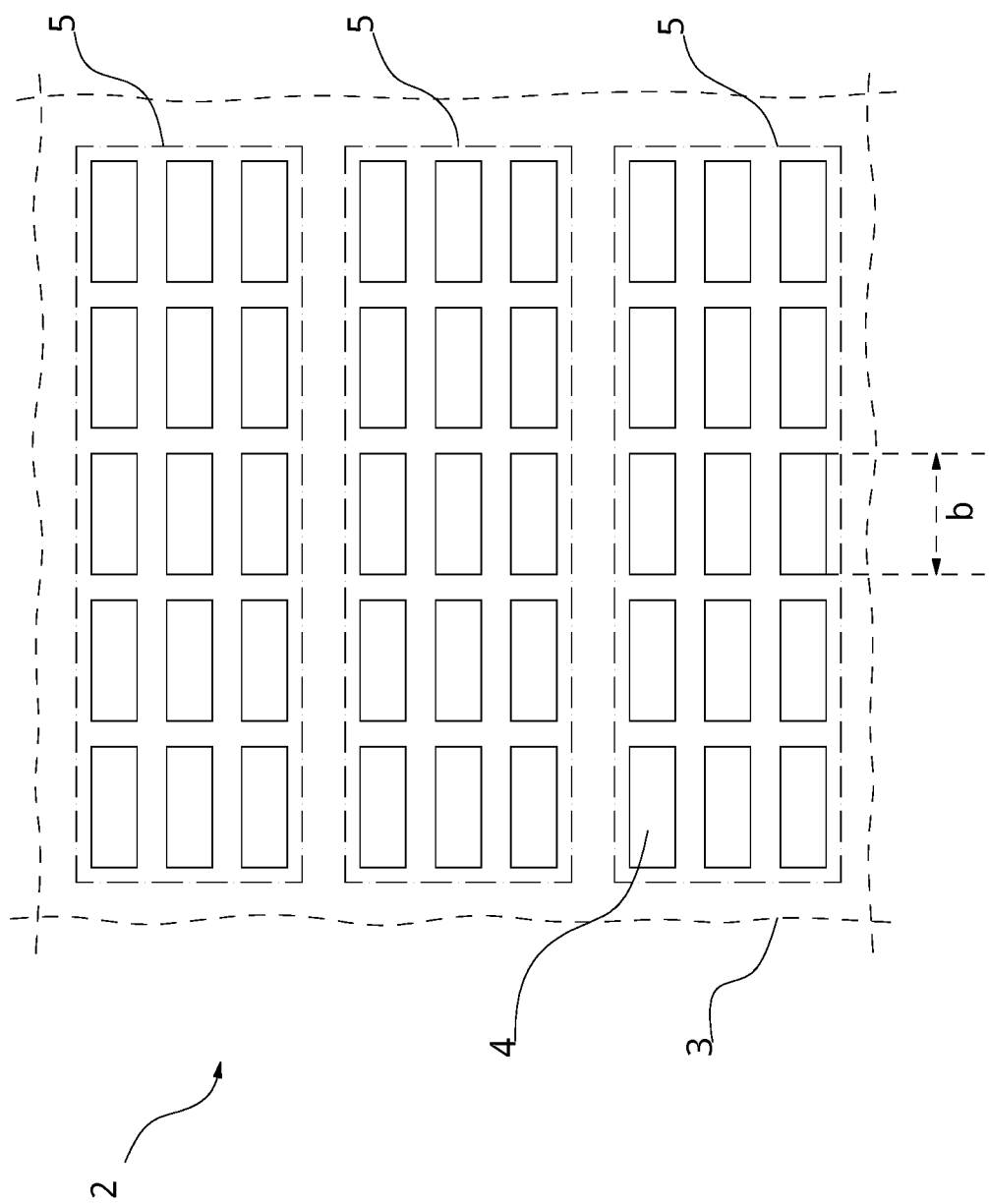
Figure 3:
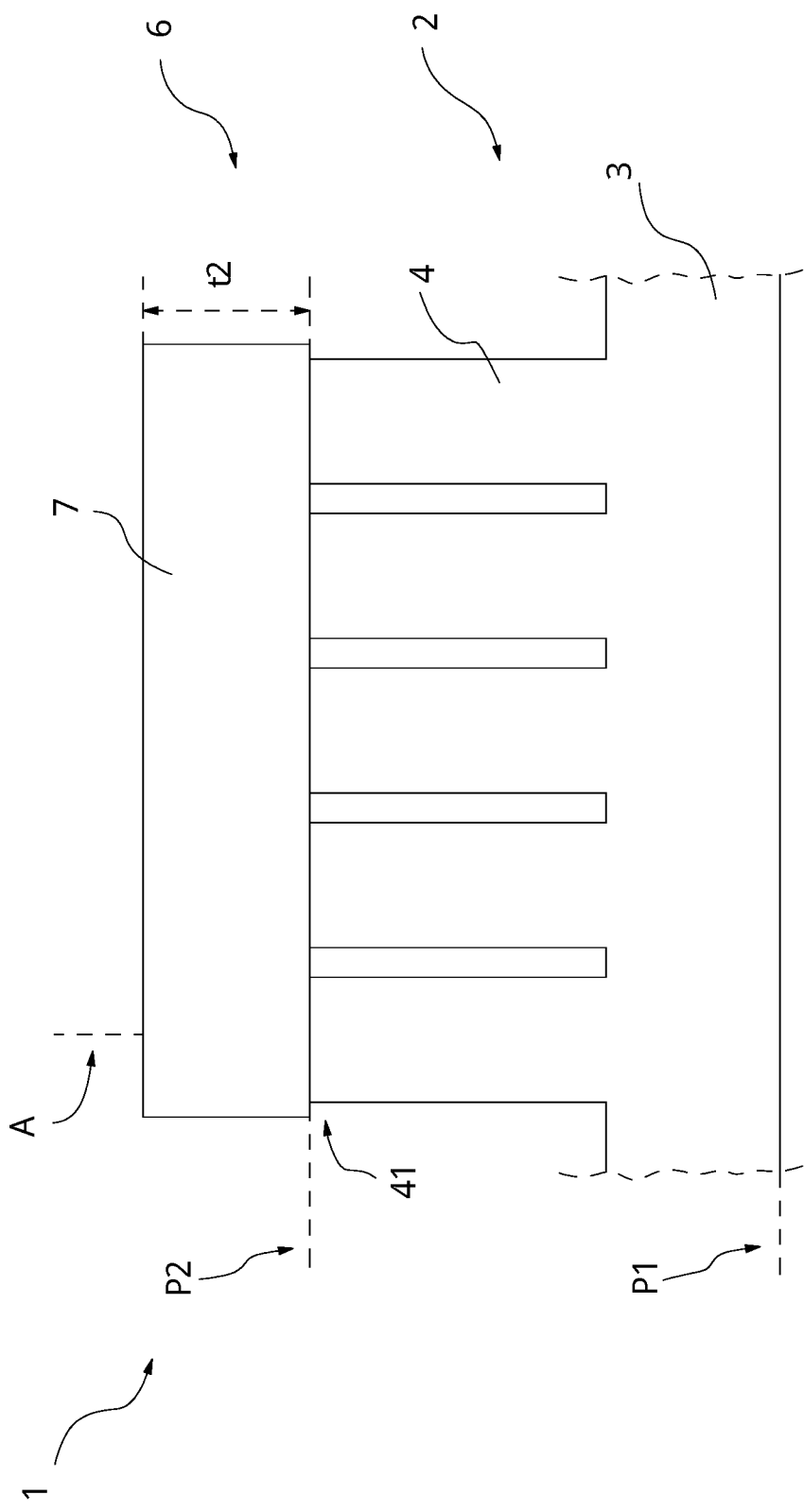
Figure 4:
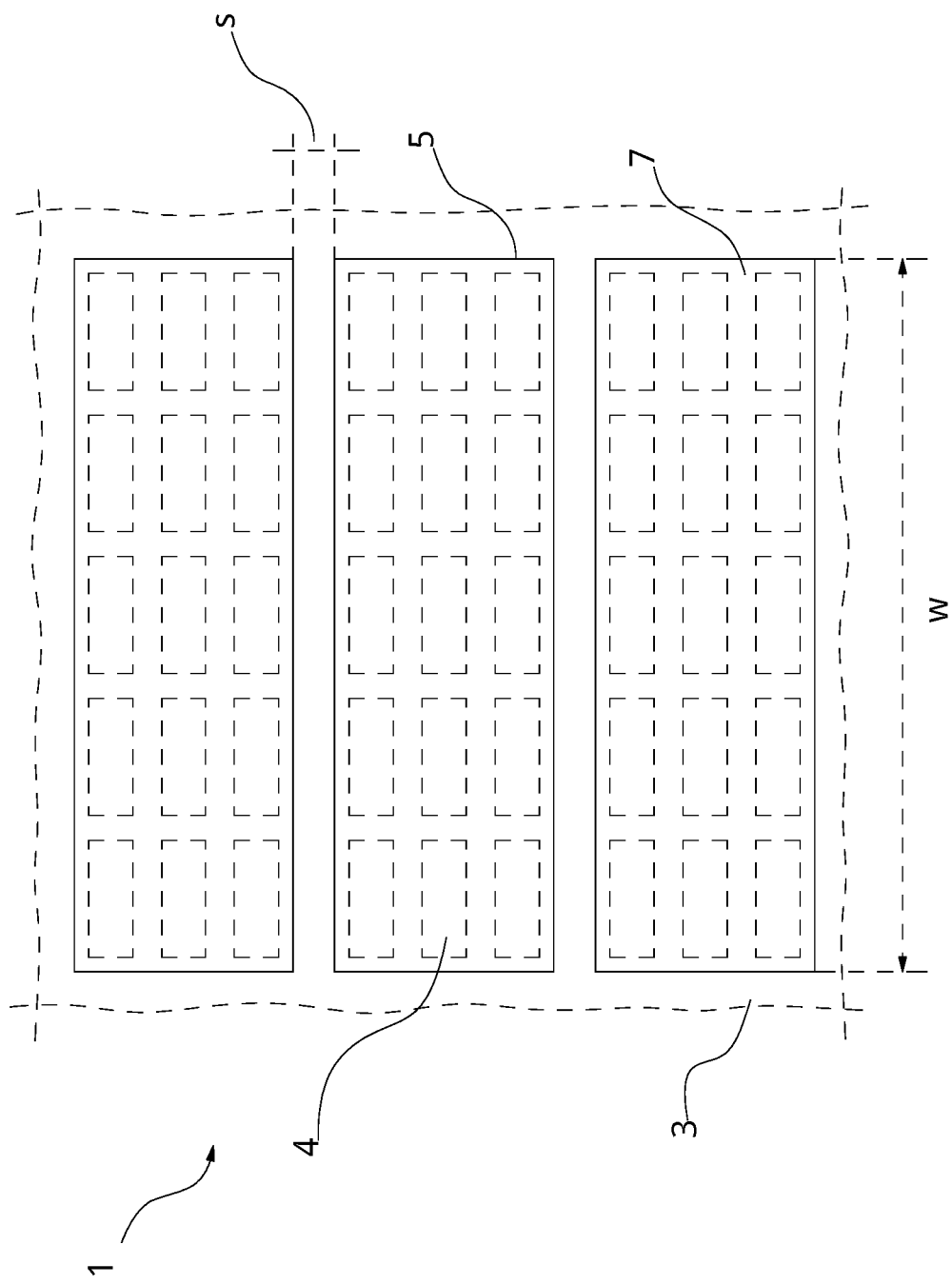

FIGS. 2, 4 show embodiments of the semiconductor structure 1 in which the cross section of the first portions 4 of the layer 2 has a rectangular shape.

Figure 5:
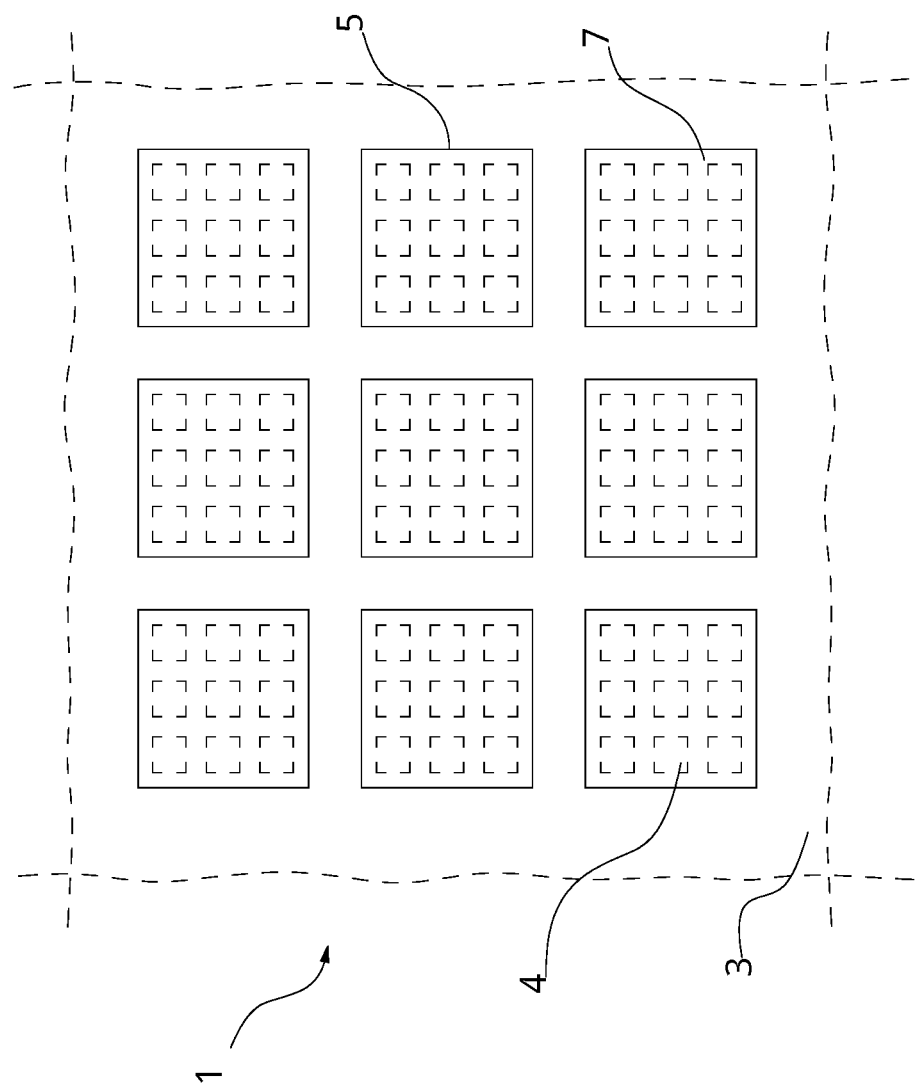
FIGS. 5-7 illustrate, by way of example, some variants of the method, according to the present invention, and of the semiconductor structure manufactured with this method.
Figure 6:
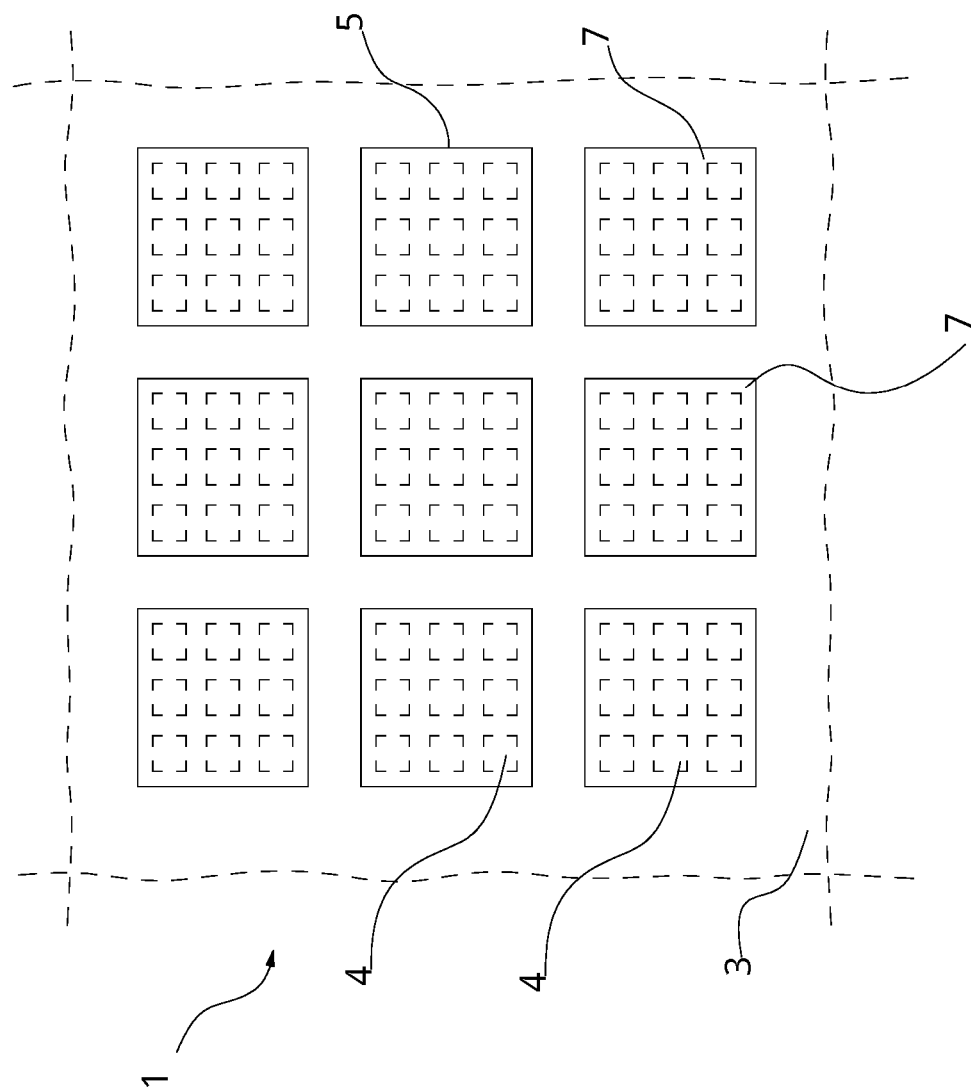

FIG. 5-6 show embodiments of the semiconductor structure 1 in which the cross section of the first portions 4 of the layer 2 has a square shape.

Figure 7:
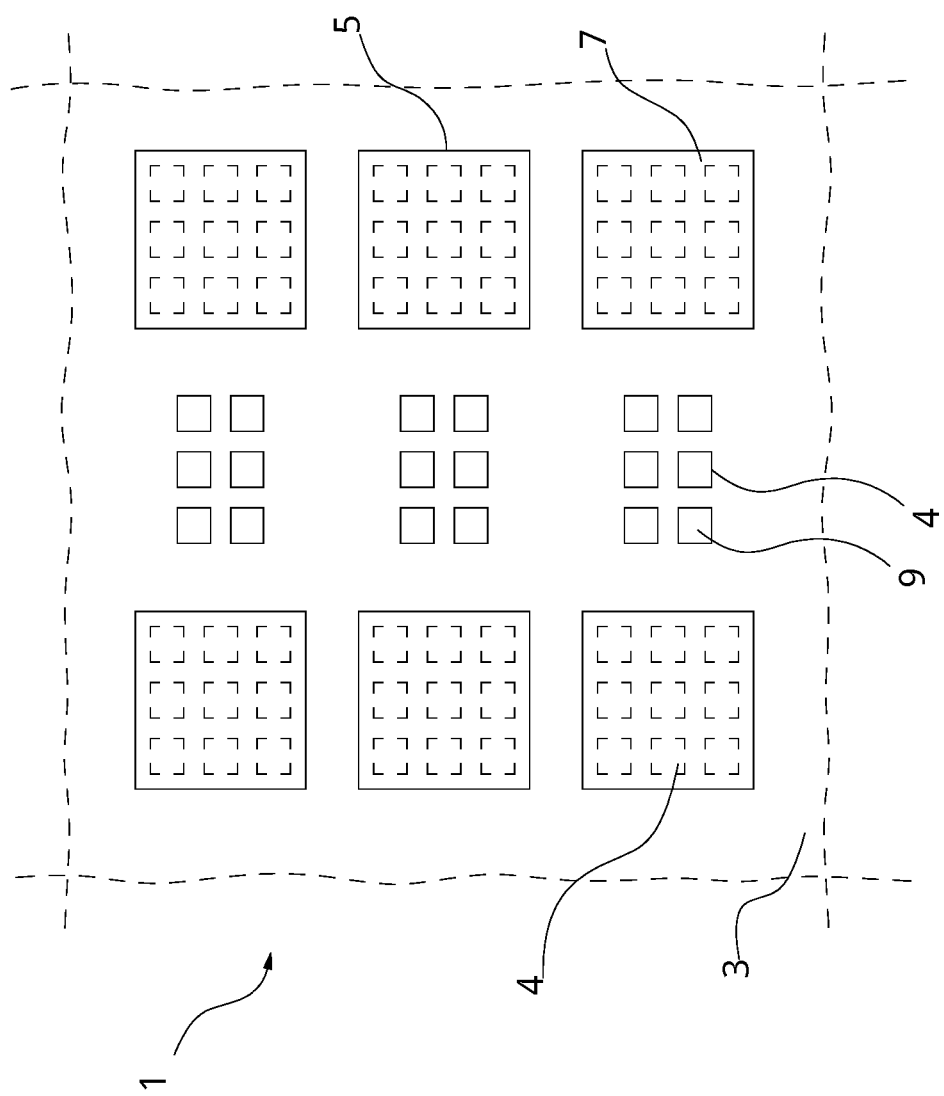

FIG. 7 shows an embodiment of the semiconductor structure 1 in which the cross section of the first portions 4 of the layer 2 has different shapes.

The first portions 4 of the layer 2 have an aspect ratio $R_A$, defined herein, in general, as the ratio between height and width of the aforesaid portions.

In other words, the aspect ratio $R_A$ of the first portions 4 of the layer 2 is defined as:

$$R_A=(h/b)$$

where h, b are respectively the height and the width of the first portions 4 of the layer 2, as defined above.

The first portions 4 of the layer 2 are mutually spaced at a separation distance d.

Preferably, the separation distance d between the first portions 4 of the layer 2 is between 2 μm and 6 μm.

Preferably, the separation distance d between the first portions 4 of the layer 2 is 2 μm.

Preferably, the first portions 4 of the first layer 2 are arranged in a plurality of groups separated from one another.

Preferably, the substrate 3 comprises a plurality of boundary areas 5, mutually spaced. Inside each boundary area 5, a corresponding group of first portions 4 of the layer 2 is advantageously arranged.

The geometric shape of the boundary areas 5 can be any, for example a polygonal (triangular, rectangular, square, hexagonal, etc.) or circular geometric shape.

The substrate 3 can comprise boundary areas 5 all having the same geometric shape or with different geometric shapes to one another.

FIGS. 2, 4 show an embodiment of the semiconductor structure 1 in which the boundary areas 5 of the substrate 3 have a rectangular shape.

FIGS. 5-6 show embodiments of the semiconductor structure 1 in which the boundary areas 5 have a square shape.

Preferably, each boundary area 5 comprises the same number of first portions 4 of the layer 2.

Preferably, inside the same boundary area 5, the first portions 4 are evenly spaced from one another.

The first portions 4 of the layer 2 can in any case have different spacing to one another inside different boundary areas 5.

Preferably, the step of supplying the first layer 2 made of said first semiconductor material comprises:
  the step of providing a wafer of said first semiconductor material;
  the step of processing said wafer of said first semiconductor material so as to obtain the first layer 2 configured as described above.

Known planar processing techniques of semiconductor materials, for example, optical lithography techniques, selective etching techniques, and the like can be used to process the wafer of said first semiconductor material (for example a 4" or 6" wafer).

For example, in order to obtain the layer 2 of first semiconductor material configured as indicated above, it is possible to process a wafer of said first semiconductor material using the techniques and the procedures described in the patent application WO2011/135432A1, incorporated herein as reference.

The method, according to the invention, comprises a second step of providing at least a second layer 6 of a second semiconductor material, different from said first semiconductor material.

Preferably, said second semiconductor material is selected among: silicon carbide (SiC), gallium nitride (GaN), germanium (Ge), gallium arsenide (GaAs) or another semiconductor material of the III-V groups.

Preferably, the second layer 6 has a monolithic structure.

According to some embodiments of the invention, however, the second layer 6 could consist of several superimposed sub-layers, according to a multi-layer type structure.

The second layer 6 comprises second portions 7 of said second semiconductor material, which are mutually spaced and extend along a second reference plane P2 substantially parallel to the first reference plane P1.

Each of the second portions 7 of the layer 6 is joined to the ends 41 of a plurality of first portions 4 of the layer 2.

In the semiconductor structure 1, the second layer 6 is adapted to form a thick film adapted to coat the first layer 2 (bulk layer) described above.

Each of the portions 7 into which the layer 6 is divided is destined to be further processed to manufacture the desired electronic devices. Therefore, the shape, dimensions and thickness of the portions 7 of the layer 6 are advantageously defined based on the type of processing required to obtain the aforesaid electronic devices.

It is important to point out how the division of the second layer 6 into a plurality of mutually spaced portions 7 allows a considerable reduction in residual lattice stresses with respect to prior art solutions in which the thick film generally consists of a continuous layer.

Preferably, the portions 7 of the layer 6 are mutually spaced at a separation distance s between 4 μm and 12 μm.

Preferably, the separation distance s between the portions 7 of the layer 2 is of 6 μm.

Preferably, the portions 7 of the layer 6 are evenly spaced from one another.

The geometric shape of the portions 7 of the layer 6 can be any, according to requirements, for example a polygonal (triangular, rectangular, square, hexagonal, etc.) or circular geometric shape.

The portions 7 of the layer 2 have a width w, defined herein, in general, as the larger dimension of the cross section of the aforesaid portions along the reference plane P2 or a plane parallel thereto (and perpendicular to the axes of extension A of the first portions of the layer 2).

For example, in the case in which the cross section of the second portions 7 has the geometric shape of a triangle, square or rectangle, the width w is the measurement of the longer side of the aforesaid cross section.

In the case in which the cross section of the second portions 7 has the geometric shape of any regular polygon with more than four sides, the width w is the measurement of the longer diagonal of the aforesaid cross section.

In the case in which the cross section of the second portions 4 has a circular shape, the width w is the measurement of the diameter of the aforesaid cross section.

In the case in which the cross section of the second portions 4 has an ellipsoidal shape, the width w is the length of the longer diameter of the aforesaid cross section.

Further examples are possible in view of the shape of the cross section of the second portions 7 of the layer 6.

FIG. 4 shows an embodiment of the semiconductor structure 1 in which the second portions 7 of the layer 6 have a rectangular cross section.

FIGS. 5-6 show embodiments of the semiconductor structure 1 in which the second portions 7 of the layer 6 have a square cross section.

Preferably, the width w of the second portions 7 of the layer 6 is between 100 μm and 1000 μm.

The layer 6 (and the related second portions 7) has a thickness t2, measured along a plane perpendicular to the reference plane P2.

Preferably, the thickness t2 of the second portions 7 of the layer 6 is between 2 μm and 50 μm.

Preferably, the thickness t2 of the second portions 7 of the layer 6 is between 10 μm and 25 μm.

Preferably, each of the portions 7 of the layer 6 is positioned superimposed on a respective boundary area 5 of the substrate 3 so as to be joined to the ends 41 of the portions 4 of the layer 2 arranged inside the aforesaid boundary area 5.

Preferably, each of the second portions 7 of the second layer 6 extends continuously, i.e. without separation spaces, at the respective boundary area 5 so as to produce a continuous coating of the portions 4 of the first layer 2 at the aforesaid boundary area.

According to an embodiment of the method according to the invention, the step of providing the second layer 6 made of said second semiconductor material comprises:
  the step of depositing, by means of epitaxial deposition, said second semiconductor material at the first portions 4 of the first layer 2 (in particular at the ends 41 of the first portions 4 of the layer 2);
  the step of processing the second semiconductor material deposited so as to obtain the layer 6 comprising a plurality of mutually spaced second portions 7 of said second semiconductor material.

Epitaxial deposition techniques of known type can be used to deposit said second semiconductor material at the first portions 4 of the first layer 2, for example the techniques and the procedures described in the patent application WO2011/135432A1.

Known planar processing techniques of semiconductor materials, such as optical lithography techniques, selective etching techniques, and the like, can be used to process the second semiconductor material deposited at the first portions 4 of the first layer 2.

According to an embodiment of the method according to the invention, the step of providing the second layer 6 made of said second semiconductor material comprises:
  providing a wafer of said second semiconductor material:
  bonding the wafer of said second semiconductor material to the first portions 4 of the first layer 2 (in particular of the ends 41 of the first portions 4 of the layer 2);
  processing the wafer of said second semiconductor material bonded so as to obtain the layer 6 comprising a plurality of mutually spaced second portions 7 of said second semiconductor material.

Known thermal wafer bonding techniques can be used to bond the wafer of said second semiconductor material (for example a 4" or 6" wafer) of the first portions 4 of the first layer 2.

Known planar processing techniques of semiconductor materials, such as optical lithography techniques, selective etching techniques, and the like, can be used to process the wafer of said second semiconductor material bonded at the first portions 4 of the first layer 2.

According to the invention, the first portions 4 of the first layer 2 are produced with an aspect ratio $R_A$ that depends on a dimension (in particular on the width w as defined above) of the second portions 7 of the layer 6, measured along the second reference plane P2 or a plane parallel thereto (and perpendicular to the axes of extension A of the first portions 4 of the layer 2).

In particular, the first portions 4 of the first layer 2 are produced with an aspect ratio $R_A$ that depends on a dimension (in particular on the width w as defined above) of the second portions 7 of the layer 6, according to a non-linear dependence function, more particularly of sub-linear type.

For the sake of clarity, it is here specified that, as widely known, any function f(x) is defined of sub-linear type if the following condition occurs $$\lim_{x \to \infty} \left( \frac{f(x)}{x} \right) = 0.$$

Preferably, the first portions 4 of the first layer 2 are produced with an aspect ratio $R_A$ that depends on a dimension (in particular on the width w as defined above) of the second portions 7 of the layer 6, according to a dependence function of the type:

$$R_A = (h/b) = C(w/W_R)^{k1}$$

wherein:
h is the height of the first portions 4 of the layer 2, as defined above;
b is the width of the first portions 4 of the layer 2, as defined above.
$W_R = 1000$ μm is a reference value for the dimension of said second portions;
k1 is a coefficient lower than 1, with $0.5 \leq k1 \leq 0.8$, more preferably with $0.65 \leq k1 \leq 0.8$;
C is a coefficient that depends on the characteristics of said first and second layers.

The coefficient C indicated above depends, for example, on the materials that form the aforesaid layers 2, 6, on the thickness of these layers and on the minimum radius of curvature R to be obtained for the semiconductor structure 1 in order to ensure the processability of the layer 6 of this latter to manufacture the desired electronic devices.

For the desired applications, the coefficient C is included in the range [10, 50], preferably in the range [20, 40].

As an example, the coefficient C can advantageously be determined by means of interpolations of data relating to finite element numerical simulations, after defining the materials of the layers 2, 6 of the semiconductor structure 1 and the thickness of these layers, as well as the maximum bowing (or the minimum radius of curvature R) acceptable for the semiconductor structures to be obtained.

The table below illustrates some examples of the value of the coefficient C for different embodiments of the semiconductor structure 1 to be manufactured with the established physical characteristics of the first layer 2 and of the second layer 6 and with the indicated minimum radius of curvature acceptable.

In the embodiments of the semiconductor structure 1 indicated in the table below:
the first layer 2 comprises first portions 4 with square cross section and evenly spaced with separation distance d=2 μm;
the second layer 6 comprises second portions 7 with square cross section and evenly spaced with separation distance s=4 μm.

| Embodiment | Material of the first layer | Material of the second layer | Thickness of the first layer (μm) | Thickness of the second layer (μm) | Minimum Radius (m) | Coefficient C | Coefficient k1 |
|---|---|---|---|---|---|---|---|
| #9 | Si (100) | SiC (111) | 1000 | 15 | 25 | 19.26 | 0.69 |
| #10 | Si (100) | GaN | 1000 | 15 | 25 | 15.75 | 0.73 |
| #11 | Si (100) | Ge | 1000 | 15 | 25 | 13.03 | 0.77 |

Preferably, the first portions 4 of the first layer 2 are produced with an aspect ratio $R_A$ that depends on a dimension (in particular on the width w as defined above) of the second portions 7 of the layer 6, according to a dependence function of the type:

$$R_A = (h/b) = -A + B(w/W_R)^{k2}$$

wherein:
h is the height of the first portions 4 of the layer 2, as defined above;
b is the width of the first portions 4 of the layer 2, as defined above.
$W_R = 1000$ μm is a reference value for the width of the second portions 7 of the layer 6, as defined above;
k2 is a coefficient lower than 1, with $0.5 \leq k2 \leq 0.8$, more preferably with $0.5 \leq k2 \leq 0.7$;
A, B are coefficients that depend on the physical characteristics of the first layer 2 and of the second layer 6.

The coefficients A, B indicated above depend, for example, on the materials that form the aforesaid layers 2, 6, on the thickness of these layers and on the minimum radius of curvature R to be obtained for the semiconductor structure 1 in order to ensure the processability of the layer 6 of this latter to manufacture the desired electronic devices.

For the desired applications, the coefficient A is included in the range [1, 15] and the coefficient B is included in the range [10, 50], preferably in the range [10, 40].

As an example, the coefficients A, B can advantageously be determined by means of interpolations of data relating to finite element numerical simulations, after defining the materials of the layers 2, 6 of the semiconductor structure 1 and the thickness of these layers, as well as the maximum bowing (or the minimum radius of curvature R) acceptable for the semiconductor structures to be obtained.

The table below illustrates some examples of the values of the coefficients A, B for different embodiments of the semiconductor structure 1 to be manufactured with the established physical characteristics of the first layer 2 and of the second layer 6 and with the indicated minimum radius of curvature acceptable.

| Embodiment | Material of the first layer | Material of the second layer | Thickness of the first layer (μm) | Thickness of the second layer (μm) | Minimum Radius (m) | Coefficient A | Coefficient B | Coefficient k2 |
|---|---|---|---|---|---|---|---|---|
| #1 | Si (100) | Ge | 1000 | 10 | 30 | 8.8 | 21.4 | 0.66 |
| #2 | Si (100) | Ge | 1000 | 15 | 25 | 9.5 | 22.4 | 0.66 |
| #3 | Si (100) | Ge | 500 | 15 | 25 | 14.4 | 39.0 | 0.66 |
| #4 | Si (111) | 3C—SiC | 1000 | 15 | 25 | 11.1 | 30.0 | 0.66 |
| #5 | Si (100) | GaN (cubic phase) | 1000 | 15 | 10 | 10.0 | 25.2 | 0.66 |
| #6 | Si (100) | SiC (111) | 1000 | 15 | 25 | 2.07 | 21.27 | 0.59 |
| #7 | Si (100) | GaN | 1000 | 15 | 25 | 1.98 | 17.67 | 0.61 |
| #8 | Si (100) | SiC (111) | 1000 | 15 | 25 | 2.94 | 15.88 | 0.57 |

In the embodiments of the semiconductor structure 1 indicated in the table above:
the first layer 2 comprises first portions 4 with square cross section and evenly spaced with separation distance d=2 μm;
the second layer 6 comprises second portions 7 with square cross section and evenly spaced with separation distance s=4 μm;

As already pointed out, in the semiconductor structures 1 obtained by means of the method according to the invention, there is a relation between the aspect ratio $R_A$ of the first portions 4 of the first layer 2 and a dimension (in particular the width w) of the second portions 7 of the second layer 6.

Finite element simulation analysis surprisingly showed how, in relevant cases for power electronic devices, this relation is substantially independent of the thickness t2 of the layer 6 of the aforesaid structures, in particular in the case in which this latter is made of a material with high elastic stiffness, as in the case of SiC.

Figure 9:
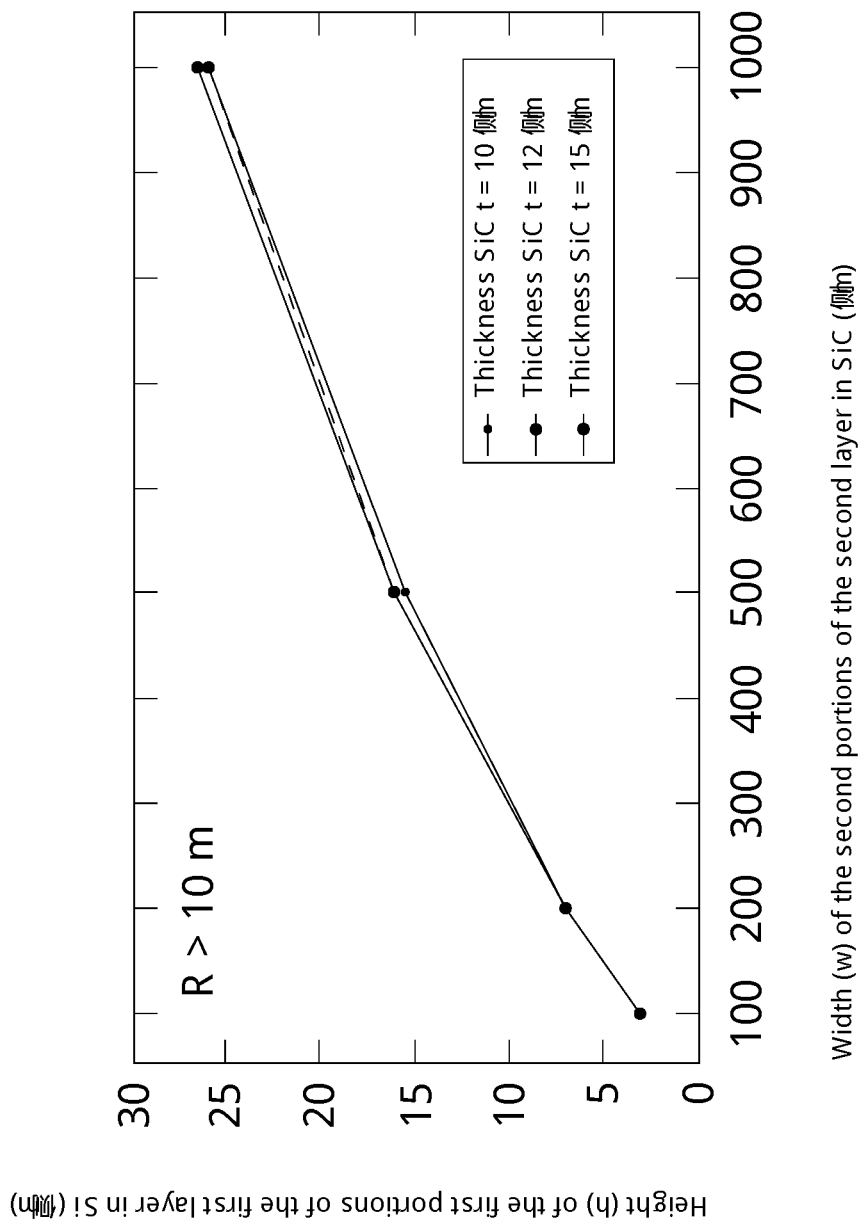
FIGS. 9-10 illustrate schematically some numerical data related to some embodiments of the method, according to the present invention, and of the semiconductor structure manufactured with this method.
Figure 10:
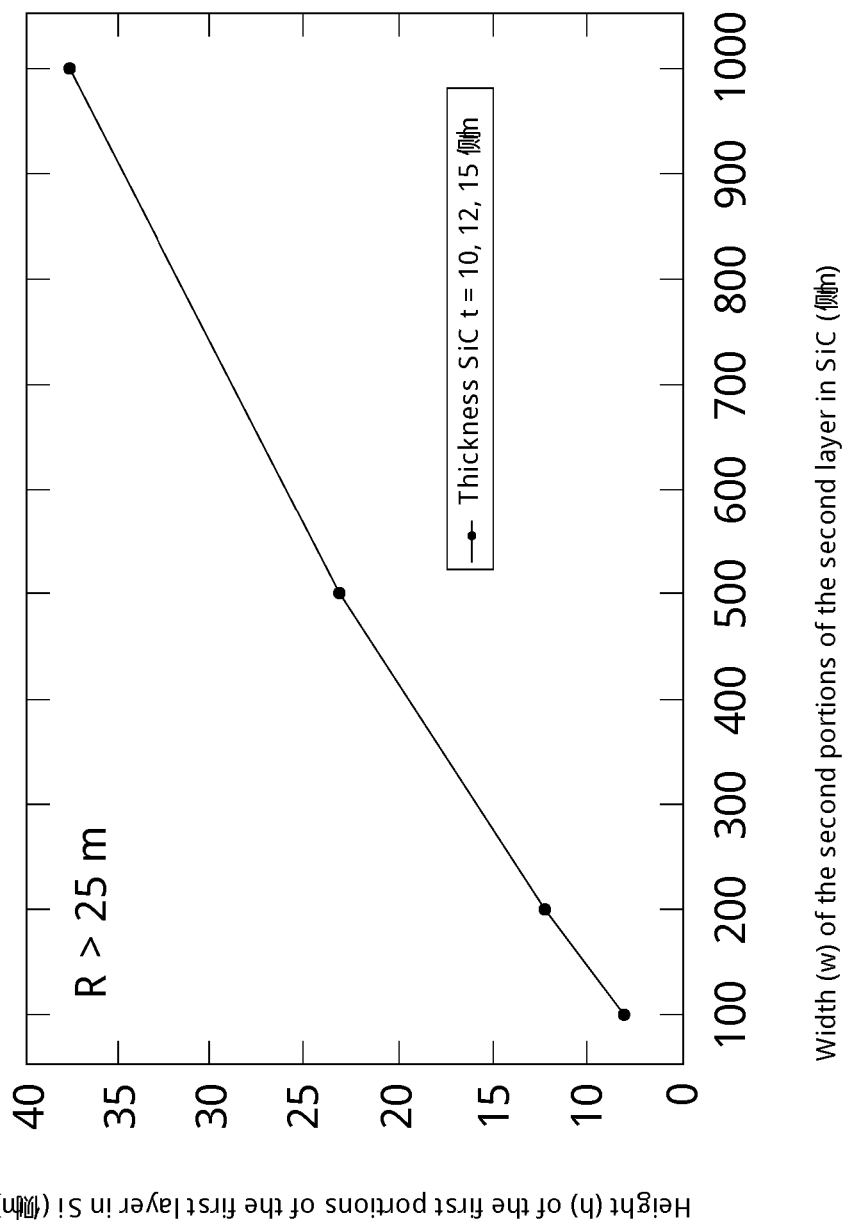

FIGS. 9-10 show some curves that express the relation between height h of the first portions 4 of the layer 2 and width w of the second portions 7 of the layer 6 for semiconductor structures according to the invention, in which the first layer 2 is to be made of Si (111), the second layer 6 is made of 3C—SiC with different values of thickness t2, and the width b of the first portions 4 of the layer 2 is predetermined with b=2 μm, while the distance between them is predetermined with d=2 μm.

It is evident that, as the width b of the first portions 4 of the layer 2 is predefined, the graphs of FIGS. 9-10 are indicative of the relation existing between aspect ratio $R_A$=h/b of the first portions 4 of the layer 2 and width w of the second portions 7 of the layer 6 for the semiconductor structures described above.

As is shown in FIGS. 9-10, this relation makes it possible to obtain, respectively, a desired radius of curvature R≥10 m (wafers of 4") and R≥25 (wafers of 6") for the aforesaid structures so as to ensure the subsequent processability thereof.

Some examples of embodiment of semiconductor structures according to the invention will now be described.

Example #1

Manufacture of a semiconductor structure in which:
the first layer 2 is made of Si (100);
the second layer 6 is made of Ge;
the thickness of the first layer is t1=1000 μm;
the thickness of the second layer is t2=10 μm;
the first layer 2 comprises first portions 4 with square shaped cross section evenly spaced with separation distance d=2 μm;
the second layer 6 comprises second portions 7 with square shaped cross section evenly spaced with separation distance s=4 μm;
$W_R$=1000 μm;
the aspect ratio is defined by the following relation:

$$R_A=(h/b)=-8.8+21.4(w/W_R)^{0.66}$$

wherein h is the height of the first portions 4 of the layer 2, with 8 μm≤h≤40 μm;
b is the width of the first portions 4 of the layer 2, with 2 μm≤b≤6 μm;
w is the width of the second portions 7 of the layer 6, with 100 μm≤w≤1000 μm;
$W_R$ is width of reference for the second portions 7 of the layer 6, with $W_R$=1000 μm.

For the second portions 7 of the layer 6, a width w=500 μm was selected (based on the processing operations to be implemented to manufacture the desired electronic devices).

Based on the relation above, the aspect ratio for the first portions 4 of the layer 2 is $R_A$=8.1.

For the first portions 4 of the layer 2, a width b=2 μm was selected (based on the lithographic processing limits available).

The height h of the first portions 4 of the layer 2 is therefore equal to h=16.2 μm.

The semiconductor structure thus manufactured has a radius of curvature R≥30 m in the presence of residual lattice stresses.

Example #2

Manufacture of a semiconductor structure in which:
the first layer 2 is made of Si (100);
the second layer 6 is made of Ge;
the thickness of the first layer is t1=1000 μm;
the thickness of the second layer is t2=15 μm;
the first layer 2 comprises first portions 4 with square shaped cross section evenly spaced with separation distance d=2 μm;
the second layer 6 comprises second portions 7 with square shaped cross section evenly spaced with separation distance s=4 μm;
$W_R$=1000 μm;
the aspect ratio is defined by the following relation:

$$R_A=(h/b)=-9.5+22.4(w/W_R)^{0.66}$$

wherein h is the height of the first portions 4 of the layer 2, with 8 μm≤h≤40 μm;
b is the width of the first portions 4 of the layer 2, with 2 μm≤b≤6 μm;
w is the width of the second portions 7 of the layer 6, with 100 μm≤w≤1000 μm;

$W_R$ is width of reference for the second portions 7 of the layer 6, with $W_R$=1000 µm.

For the second portions 7 of the layer 6, a width w=1000 µm was selected (based on the processing operations to be implemented to manufacture the desired electronic devices). Based on the relation above, the aspect ratio per the first portions 4 of the layer 2 is $R_A$=12.9.

For the first portions 4 of the layer 2, a width b=2 µm was selected (based on the lithographic processing limits available).

The height h of the first portions 4 of the layer 2 is therefore equal to h=25.8 µm.

The semiconductor structure thus manufactured has a radius of curvature R≥25 m in the presence of residual lattice stresses.

Example #3

Manufacture of a semiconductor structure in which:
the first layer 2 is made of Si (100);
the second layer 6 is made of Ge;
the thickness of the first layer is t1=500 µm;
the thickness of the second layer is t2=15 µm;
the first layer 2 comprises first portions 4 with square shaped cross section evenly spaced with separation distance d=2 µm;
the second layer 6 comprises second portions 7 with square shaped cross section evenly spaced with separation distance s=4 µm;
$W_R$=1000 µm;
the aspect ratio is defined by the following relation:

$$R_A=(h/b)=-14.4+39(w/W_R)^{0.66}$$

wherein h is the height of the first portions 4 of the layer 2, with 8 µm≤h≤50 µm;
b is the width of the first portions 4 of the layer 2, with 2 µm≤b≤6 µm;
w is the width of the second portions 7 of the layer 6, with 100 µm≤w≤1000 µm;
$W_R$ is width of reference for the second portions 7 of the layer 6, with $W_R$=1000 µm.

For the second portions 7 of the layer 6, a width w=1000 µm was selected (based on the processing operations to be implemented to manufacture the desired electronic devices). Based on the relation above, the aspect ratio for the first portions 4 of the layer 2 is $R_A$=24.6. For the first portions 4 of the layer 2, a width b=2 µm was selected (based on the lithographic processing limits available).

The height h of the first portions 4 of the layer 2 is therefore equal to h=49.2 µm. The semiconductor structure thus manufactured has a radius of curvature R≥25 m in the presence of residual lattice stresses.

Example #4

Manufacture of a semiconductor structure in which:
the first layer 2 is made of Si (111);
the second layer 6 is made of 3C—SiC;
the thickness of the first layer is t1=1000 µm;
the thickness of the second layer is t2=15 µm;
the first layer 2 comprises first portions 4 with square shaped cross section evenly spaced with separation distance d=2 µm;
the second layer 6 comprises second portions 7 with square shaped cross section evenly spaced with separation distance s=4 µm;
$W_R$1000 µm;
the aspect ratio is defined by the following relation;

$$R_A=(h/b)=-11.1+30(w/W_R)^{0.66}$$

wherein h is the height of the first portions 4 of the layer 2, with 8 µm≤h≤40 µm;
b is the width of the first portions 4 of the layer 2, with 2 µm≤b≤6 µm;
w is the width of the second portions 7 of the layer 6, with 100 µm≤w≤1000 µm;
$W_R$ is the maximum width established for the second portions 7 of the layer 6, with $W_{Rb=1000}$ µm.

For the second portions 7 of the layer 6, a width w=300 µm was selected (based on the processing operations to be implemented to manufacture the desired electronic devices). Based on the relation above, the aspect ratio for the first portions 4 of the layer 2 is $R_A$=9.6. For the first portions 4 of the layer 2, a width b=2 µm was selected (based on the lithographic processing limits available).

The height h of the first portions 4 of the layer 2 is therefore equal to h=19.2 µm. The semiconductor structure thus manufactured has a radius of curvature R≥25 m in the presence of residual lattice stresses.

Example #5

Manufacture of a semiconductor structure in which:
the first layer 2 is made of Si (100);
the second layer 6 is made of GaN (cubic);
the thickness of the first layer is t1=1000 µm;
the thickness of the second layer is t2=15 µm;
the first layer 2 comprises first portions 4 with square shaped cross section evenly spaced with separation distance d=2 µm;
the second layer 6 comprises second portions 7 with square shaped cross section evenly spaced with separation distance s=4 µm;
$W_R$=1000 µm;
the aspect ratio is defined by the following relation:

$$R_A=(h/b)=-10+25.2(w/W_R)^{0.66}$$

wherein h is the height of the first portions 4 of the layer 2, with 3 µm≤h≤40 µm;
b is the width of the first portions 4 of the layer 2, with 2 µm≤b≤6 µm;
w is the width of the second portions 7 of the layer 6, with 100 µm≤w≤1000 µm;
$W_R$ is width of reference for the second portions 7 of the layer 6, with $W_R$=1000 µm.

For the second portions 7 of the layer 6, a width w=100 µm was selected (based on the processing operations to be implemented to manufacture the desired electronic devices). Based on the relation above, the aspect ratio for the first portions 4 of the layer 2 is $R_A$=1.6. For the first portions 4 of the layer 2, a width b=2 µm was selected (based on the lithographic processing limits available).

The height h of the first portions 4 of the layer 2 is therefore equal to h=3.2 µm.

The semiconductor structure thus manufactured has a radius of curvature R≥10 m in the presence of residual lattice stresses.

Example #6

Manufacture of a semiconductor structure in which:
the first layer 2 is made of Si (100);
the second layer 6 is made of Ge;
the thickness of the first layer is t1=1000 µm;

the thickness of the second layer is t2=15 μm;
the first layer 2 comprises first portions 4 with square shaped cross section evenly spaced with separation distance d=2 μm;
the second layer 6 comprises second portions 7 with square shaped cross section evenly spaced with separation distance s=4 μm;
$W_R$=1000 μm;
the aspect ratio is defined by the following relation:

$$R_A=(h/b)=-2.94+15.88(w/W_R)^{0.57}$$

wherein h is the height of the first portions 4 of the layer 2, with 3 μm≤h≤40 μm;
b is the width of the first portions 4 of the layer 2, with 2 μm≤b≤6 μm;
w is the width of the second portions 7 of the layer 6, with 100 μm≤w≤1000 μm;
$W_R$ is width of reference for the second portions 7 of the layer 6, with $W_R$=1000 μm.

For the second portions 7 of the layer 6, a width w=300 μm was selected (based on the processing operations to be implemented to manufacture the desired electronic devices).

Based on the relation above, the aspect ratio for the first portions 4 of the layer 2 is $R_A$=5.0. For the first portions 4 of the layer 2, a width b=2 μm was selected (based on the lithographic processing limits available).

The height h of the first portions 4 of the layer 2 is therefore equal to h=15 μm.

The semiconductor structure thus manufactured has a radius of curvature R≥25 m in the presence of residual lattice stresses.

Example #7

Manufacture of a semiconductor structure in which:
the first layer 2 is made of Si (111);
the second layer 6 is made of SiC (111);
the thickness of the first layer is t1=1000 μm;
the thickness of the second layer is t2=15 μm;
the first layer 2 comprises first portions 4 with square shaped cross section evenly spaced with separation distance d=2 μm;
the second layer 6 comprises second portions 7 with square shaped cross section evenly spaced with separation distance s=4 μm;
$W_R$=1000 μm;
the aspect ratio is defined by the following relation:

$$R_A=(h/b)=-2.07+21.27(w/W_R)^{0.59}$$

wherein h is the height of the first portions 4 of the layer 2, with 3 μm≤h≤40 μm;
b is the width of the first portions 4 of the layer 2, with 2 μm≤b≤6 μm;
w is the width of the second portions 7 of the layer 6, with 100 μm≤w≤1000 μm;
$W_R$ is width of reference for the second portions 7 of the layer 6, with $W_R$=1000 μm.

For the second portions 7 of the layer 6, a width w=1000 μm was selected (based on the processing operations to be implemented to manufacture the desired electronic devices).

Based on the relation above, the aspect ratio for the first portions 4 of the layer 2 is $R_A$=19.2.

For the first portions 4 of the layer 2, a width b=2 μm was selected (based on the lithographic processing limits available).

The height h of the first portions 4 of the layer 2 is therefore equal to h=38.4 μm.

The semiconductor structure thus manufactured has a radius of curvature R≥25 m in the presence of residual lattice stresses.

Example #8

Manufacture of a semiconductor structure in which:
the first layer 2 is made of Si (100);
the second layer 6 is made of GaN in the cubic structure;
the thickness of the first layer is t1=1000 μm;
the thickness of the second layer is t2=15 μm;
the first layer 2 comprises first portions 4 with square shaped cross section evenly spaced with separation distance d=2 μm;
the second layer 6 comprises second portions 7 with square shaped cross section evenly spaced with separation distance s=4 μm;
$W_R$=1000 μm;
the aspect ratio is defined by the following relation:

$$R_A=(h/b)=-1.98+17.67(w/S_R)^{0.61}$$

wherein h is the height of the first portions 4 of the layer 2, with 3 μm≤h≤40 μm;
b is the width of the first portions 4 of the layer 2, with 2 μm≤b≤6 μm;
w is the width of the second portions 7 of the layer 6, with 100 μm≤w≤1000 μm;
$W_R$ is width of reference for the second portions 7 of the layer 6, with $W_R$=1000 μm.

For the second portions 7 of the layer 6, a width w=200 μm was selected (based on the processing operations to be implemented to manufacture the desired electronic devices).

Based on the relation above, the aspect ratio for the first portions 4 of the layer 2 is $R_A$=4.66.

For the first portions 4 of the layer 2, a width b=2 μm was selected (based on the lithographic processing limits available).

The height h of the first portions 4 of the layer 2 is therefore equal to h=9.13 μm.

The semiconductor structure thus manufactured has a radius of curvature R≥25 m in the presence of residual lattice stresses.

Example #9

Manufacture of a semiconductor structure in which:
the first layer 2 is made of Si (100);
the second layer 6 is made of Ge;
the thickness of the first layer is t1=1000 μm;
the thickness of the second layer is t2=15 μm;
the first layer 2 comprises first portions 4 with square shaped cross section evenly spaced with separation distance d=2 μm;
the second layer 6 comprises second portions 7 with square shaped cross section evenly spaced with separation distance s=4 μm;
$W_R$=1000 μm;
the aspect ratio is defined by the following relation:

$$R_A=(h/b)=13.03(w/W_R)^{0.77}$$

wherein h is the height of the first portions 4 of the layer 2, with 3 μm≤h≤40 μm;
b is the width of the first portions 4 of the layer 2, with 2 μm≤b≤6 μm;
w is the width of the second portions 7 of the layer 6, with 100 μm≤w≤1000 μm;
$W_R$ is width of reference for the second portions 7 of the layer 6, with $W_R$=1000 μm.

For the second portions 7 of the layer 6, a width w=1000 μm was selected (based on the processing operations to be implemented to manufacture the desired electronic devices).

Based on the relation above, the aspect ratio for the first portions 4 of the layer 2 is $R_A$=13.03.

For the first portions 4 of the layer 2, a width b=2 μm was selected (based on the lithographic processing limits available).

The height h of the first portions 4 of the layer 2 is therefore equal to h=26.06 μm.

The semiconductor structure thus manufactured has a radius of curvature R≥25 m in the presence of residual lattice stresses.

Example #10

Manufacture of a semiconductor structure in which:
the first layer 2 is made of Si(111);
the second layer 6 is made of SiC(111);
the thickness of the first layer is t1=1000 μm;
the thickness of the second layer is t2=15 μm;
the first layer 2 comprises first portions 4 with square shaped cross section evenly spaced with separation distance d=2 μm;
the second layer 6 comprises second portions 7 with square shaped cross section evenly spaced with separation distance s=4 μm;
$W_R$=1000 μm;
the aspect ratio is defined by the following relation:

$$R_A=(h/b)=19.26(w/W_R)^{0.69}$$

wherein h is the height of the first portions 4 of the layer 2, with 3 μm≤h≤40 μm;
b is the width of the first portions 4 of the layer 2, with 2 μm≤b≤6 μm;
w is the width of the second portions 7 of the layer 6, with 100 μm≤w≤1000 μm;
$W_R$ is width of reference for the second portions 7 of the layer 6, with $W_R$=1000 μm.

For the second portions 7 of the layer 6, a width w=1000 μm was selected (based on the processing operations to be implemented to manufacture the desired electronic devices).

Based on the relation above, the aspect ratio for the first portions 4 of the layer 2 is $R_A$=19.26.

For the first portions 4 of the layer 2, a width b=2 μm was selected (based on the lithographic processing limits available).

The height h of the first portions 4 of the layer 2 is therefore equal to h=38.52 μm.

The semiconductor structure thus manufactured has a radius of curvature R≥25 m in the presence of residual lattice stresses.

In the semiconductor structures 1, obtained with the method according to the invention, the dimensions of the second portions 7 of the second layer 6 (in particular the width w of the aforesaid portions 7) can be defined based on the subsequent processing operations that must be implemented thereon to manufacture the desired electronic devices.

Given a certain width w of the portions 7 of the second layer 6, the aspect ratio $R_A$ of the first portions 4 of the first layer 2 can be easily dimensioned so that the curvature of the portions 7 of the second layer 6 is not lower than a minimum desired radius R, thus ensuring an adequate reduction of the presence of residual lattice stresses.

Figure 8:
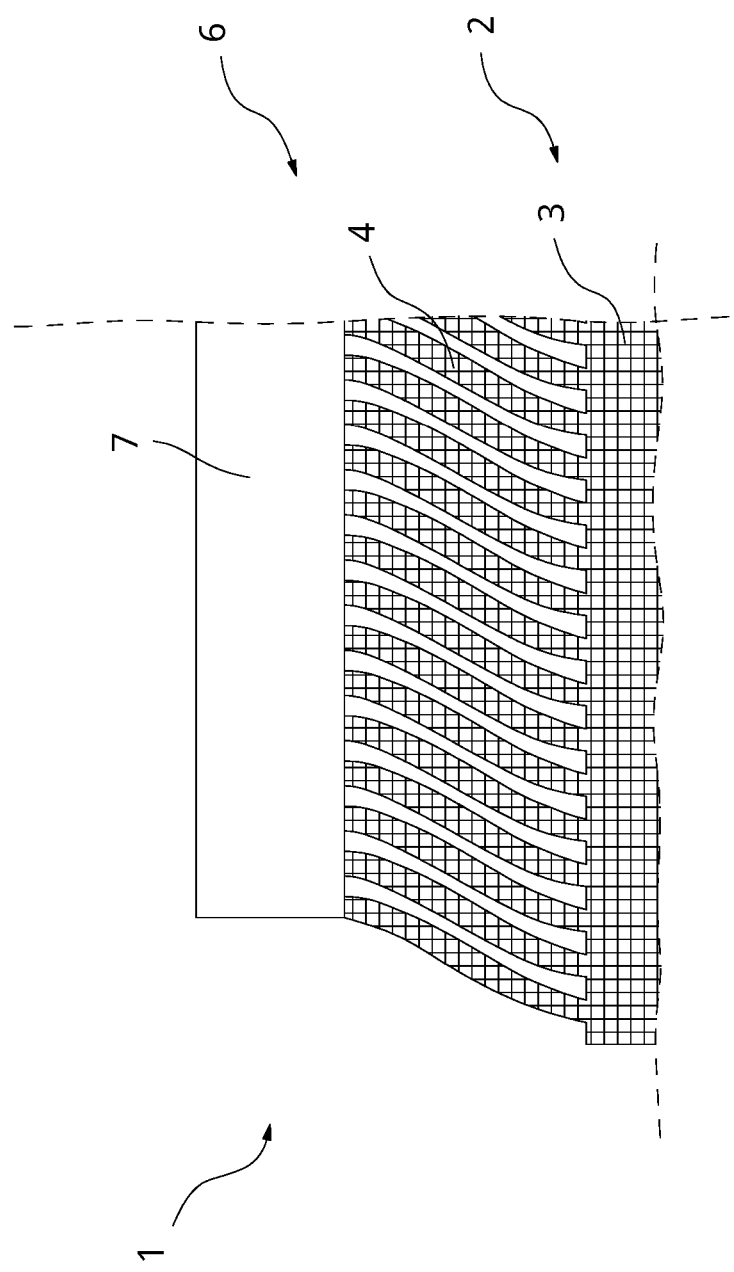
FIG. 8 illustrates schematically the behaviour of the semiconductor structure, manufactured with the method according to the present invention, in the presence of residual thermal stresses.

In this regard, it has been seen (by means of finite element simulation) how in the semiconductor structures 1 according to the invention, compensation for residual lattice stresses takes place as a result of a free lateral bending of the first portions 4 of the layer 2 (shown schematically in FIG. 8), the amount of which is correlated, according to a relation of non-linear type, to the aspect ratio $R_A$ of the first portions 4 of the layer 2 and to the physical characteristics of the layers 2 and 6, described above.

Furthermore, given a certain width w of the portions 7 of the second layer 6, the aspect ratio $R_A$ of the first portions 4 of the first layer 2 can also be easily dimensioned so that the dimensions of the first portions 4 of the first layer 2 are compatible with common industrial techniques for processing semiconductor materials (for example with the lithographic techniques commonly used in the semiconductor industry).

Moreover, the use of dependence functions of non-linear type, more in particular of sub-linear type, according to the described preferred embodiments of the method according to the invention, to dimension the aspect ratio $R_A$ of the first portions 4 of the layer 2 allows better adaptation to the physical characteristics of the layers 2 and 6, described above.

With the method according to the invention it is thus possible to obtain semiconductor structures that offer high performances in terms of reduction of residual thermal stresses (high aspect ratio for the first portions 4 of the layer 2), that are easy to reproduce on an industrial scale and that facilitate industrial manufacturing of the desired electronic devices.

FIG. 6 illustrates an embodiment of the semiconductor structure 1 in which the first portions 4 of the layer 2 have a rectangular shape and are orientated according to axes perpendicular to one another and parallel to the reference plane P1.

It has been seen how with this solution it is possible to further decrease the occurrence of residual lattice stresses between the layers 2, 6 of the semiconductor structure.

FIG. 7 illustrates an embodiment of the semiconductor structure 1 in which the layer 2 comprises first portions 4 of the layer 2 that are not arranged in corresponding boundary areas 5 but are isolated with respect to the others. These portions are individually coated by corresponding third portions 9 of the layer 6.

It has been seen how this solution makes it possible to further diminish the occurrence of residual lattice stresses between the layers 2, 6 of the semiconductor structure, while allowing a reduction of the thick film that can be utilized to manufacture the desired electronic devices. The method according to the invention has considerable advantages with respect to prior art. The method according to the invention provides semiconductor structures in which the thick film 6 consists of portions 7 separated from one another and in which these separated portions have a dimension w in relation with the aspect ratio $R_A$ of portions 4 of a bulk layer 2 destined to support the aforesaid portions 7 of thick film.

The method according to the invention thus provides semiconductor structures in which the effects of any residual thermal stresses that originate in the interface regions between the layers of different semiconductor materials, are considerably diminished.

Simultaneously, the method according to the invention provides semiconductor structures that can be easily processed to manufacture, on an industrial scale, electronic devices for applications in the field of power electronics, photonics, optoelectronics, solar energy conversion and the like.

The method according to the invention is easy to implement on an industrial scale by means of the use of processing techniques of semiconductor materials of known type, with considerable advantages in terms of limiting industrial manufacturing costs.

On the basis of the description provided, other characteristics, modifications or improvements for the invention thus conceived are possible and evident to a person skilled in the art.

These characteristics, modifications and improvements should therefore be considered part of the present invention.

The invention claimed is:

1. A method for manufacturing a semiconductor structure, which comprises:
    a step of providing at least a first layer of a first semiconductor material, said first layer comprising a substrate of said first semiconductor material, which extends along a first reference plane (P1), and a plurality of first portions of said first semiconductor material, which are mutually spaced and extend in elevation from said substrate along axes (A) perpendicular to said first reference plane (P1), said first portions having ends in distal position with respect to said substrate;
    a step of providing at least a second layer of a second semiconductor material, said second layer comprising second portions of said second semiconductor material, each of which is joined to the ends of a plurality of said first portions, said second portions being mutually spaced and extending along a second reference plane (P2) parallel to said first reference plane (P1);
    wherein said first portions have an aspect ratio ($R_A$) that depends, according to a function of sub-linear type, on a dimension (w) of second portions along said second reference plane (P2) or a parallel plane, wherein said first portion—have an aspect ratio ($R_A$) that depends on a dimension (w) of said second portions, along said second reference plane (P2) or a parallel plane, according to a function of the type:

$$R_A = C(w/W_R)^{k1}$$

wherein:
    $W_R$ is a reference value for the dimension of said second portions, with $W_R$=1000 µm;
    k1 is a coefficient lower than 1, with 0.5<=k1<=0.8;
    C is a coefficient that depends on the characteristics of said first and second layers, with 10<=C<=50.

2. The method, according to claim 1, wherein said first semiconductor material is Si.

3. The method, according to claim 1, wherein said first portions have an aspect ratio ($R_A$) that depends on a dimension (w) of said second portions, along said second reference plane (P2) or a parallel plane, according to a function of the type:

$$R_A = -A + B(w/W_R)^{k2}$$

wherein:
    $W_R$ is a reference value for the dimension of said second portions, with $W_R$=1000 µm;
    k2 is a coefficient lower than 1, with 0.5<=k2<=0.8;
    A is a coefficient that depends on the characteristics of said first and second layers, with 1<=A<=15;
    B is a coefficient that depends on the characteristics of said first and second layers, with 10<=B<=50.

4. The method, according to claim 3, wherein said substrate comprises a plurality of boundary areas, in each of which a corresponding group of said first portions is arranged, said second portions being arranged at said boundary areas.

5. The method, according to claim 3, wherein said first semiconductor material is Si.

6. The method, according to claim 3, wherein said second semiconductor material is selected among: SiC, GaN, Ge, GaAs or another semiconductor material of the III-V groups.

7. The method, according to claim 1, wherein said coefficient C is in the following range: 20<=C<=40.

8. The method, according claim 7, wherein said substrate comprises a plurality of boundary areas, in each of which a corresponding group of said first portions is arranged, said second portions being arranged at said boundary areas.

9. The method, according to claim 7, wherein said first semiconductor material is Si.

10. The method, according to claim 1, wherein said substrate comprises a plurality of boundary areas, in each of which a corresponding group of said first portions is arranged, said second portions being arranged at said boundary areas.

11. The method, according to claim 10, wherein said first semiconductor material is Si.

12. The method, according to claim 1, wherein said second semiconductor material is selected among: SiC, GaN, Ge, GaAs or another semiconductor material of the III-V groups.

13. The method, according to claim 12, wherein said first semiconductor material is Si and said second semiconductor material is SiC in a 3C—SiC phase.

14. A semiconductor structure, which comprises:
    at least a first layer of a first semiconductor material, said first layer comprising a substrate of said first semiconductor material, which extends along a first reference plane (P1), and a plurality of first portions of said first semiconductor material, which are mutually spaced and extend in elevation from said substrate along axes (A) perpendicular to said first reference plane (P1), said first portions having ends in distal position with respect to said substrate;
    at least a second layer of a second semiconductor material, said second layer comprising second portions of said second semiconductor material, each of which is joined to the ends of a plurality of said first portions, said second portions being mutually spaced and extending along a second reference plane (P2) parallel to said first reference plane (P1);
    wherein said first portions have an aspect ratio ($R_A$) that depends, according to a function of sub-linear type, on a dimension (w) of second portions along said second reference plane (P2) or a parallel plane; and
    wherein said first portions have an aspect ratio ($R_A$) that depends on a dimension (w) of said second portions along said second reference plane (P2) or a parallel plane, according to a function of the type:

$$R_A = C(w/W_R)^{k1}$$

wherein:
    $W_R$ is a reference value for the dimension of said second portions, with $W_R$=1000 µm;
    k1 is a coefficient lower than 1, with 0.5<=k1<=0.8;
    C is a coefficient that depends on the characteristics of said first and second layers, with 10<=C<=50.

15. The semiconductor structure, according to claim 14, wherein said first portions have an aspect ratio ($R_A$) that depends on a dimension (w) of said second portions, along said second reference plane (P2) or a parallel plane, according to a function of the type:

$$R_A = -A + B(w/W_R)^{k2}$$

wherein:
$W_R$ is a reference value for the dimension of said second portions, with $W_R$=1000 μm;
k2 is a coefficient lower than 1, with 0.5<=k2<=0.8;
A is a coefficient that depends on the characteristics of said first and second layers, with 1<=A<=15;
B is a coefficient that depends on the characteristics of said first and second layers, with 10<=B<=50.

16. The semiconductor structure, according to claim 14, wherein said coefficient C is in the following range: 20<=C<=40.

17. The semiconductor structure, according to claim 14, wherein said substrate comprises a plurality of boundary areas, in each of which a corresponding group of said first portions is arranged, said second portions being arranged at said boundary areas.

18. The semiconductor structure, according to claim 14, wherein said first semiconductor material is Si.

19. The semiconductor structure, according to claim 14, wherein said second semiconductor material is selected among: SiC, GaN, Ge, GaAs or another a semiconductor material of the III-V groups.

20. The semiconductor structure, according to claim 19, wherein said first semiconductor material is Si and said second semiconductor material is SiC in a 3C—SiC phase.

* * * * *